(12) United States Patent
Farkas et al.

(10) Patent No.: US 12,477,649 B2
(45) Date of Patent: Nov. 18, 2025

(54) IMPEDANCE TUNING OF MICROSTRIP TRACES

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 308 days.

(21) Appl. No.: 18/351,251

(22) Filed: Jul. 12, 2023

(65) Prior Publication Data

US 2025/0024589 A1  Jan. 16, 2025

(51) Int. Cl.
- *H05K 1/02* (2006.01)
- *H01P 3/08* (2006.01)
- *H05K 1/11* (2006.01)

(52) U.S. Cl.
CPC ............ *H05K 1/0251* (2013.01); *H01P 3/08* (2013.01); *H05K 1/0298* (2013.01); *H05K 1/115* (2013.01)

(58) Field of Classification Search
None
See application file for complete search history.

(56) References Cited

U.S. PATENT DOCUMENTS

| | | | |
|---|---|---|---|
| 10,255,876 B2 | 4/2019 | Chang et al. | |
| 2002/0084876 A1* | 7/2002 | Wright | H01P 3/081 333/1 |
| 2005/0130501 A1 | 6/2005 | Timmins et al. | |
| 2012/0274423 A1* | 11/2012 | Kato | H03H 7/38 333/238 |
| 2013/0313013 A1* | 11/2013 | Porta | H05K 1/0225 174/268 |
| 2015/0327359 A1* | 11/2015 | Tuominen | H01P 3/08 333/238 |
| 2018/0151151 A1 | 5/2018 | Chang et al. | |
| 2020/0253036 A1 | 8/2020 | Chandra et al. | |

* cited by examiner

*Primary Examiner* — Timothy J Thompson
*Assistant Examiner* — John B Freal
(74) *Attorney, Agent, or Firm* — Larson Newman, LLP (57) ABSTRACT

A printed circuit board comprising a first connection pad coupled to a first portion of a microstrip trace and a second connection pad coupled to a second portion of the microstrip trace. The microstrip trace has a first impedance along the first portion and a second impedance along the second portion. The printed circuit board also includes a conductive plane on a top surface of the microstrip trace, wherein the conductive plane includes a plurality of cutouts to reduce impedance mismatch between the first impedance and the second impedance.

20 Claims, 5 Drawing Sheets

IMPEDANCE TUNING OF MICROSTRIP TRACES

CROSS-REFERENCE TO RELATED APPLICATION

Related subject matter is contained in co-pending U.S. patent application Ser. No. 18,350,899 entitled "ENHANCED MICROSTRIP TRACE," filed of Jul. 12, 2023, the disclosure of which is hereby incorporated by reference.

FIELD OF THE DISCLOSURE

The present disclosure generally relates to information handling systems, and more particularly relates to impedance tuning of microstrip traces.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A printed circuit board comprising a first connection pad coupled to a first portion of a microstrip trace and a second connection pad coupled to a second portion of the microstrip trace. The microstrip trace has a first impedance along the first portion and a second impedance along the second portion. The printed circuit board also includes a conductive plane on a top surface of the microstrip trace, wherein the conductive plane includes a plurality of cutouts to reduce impedance mismatch between the first impedance and the second impedance.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
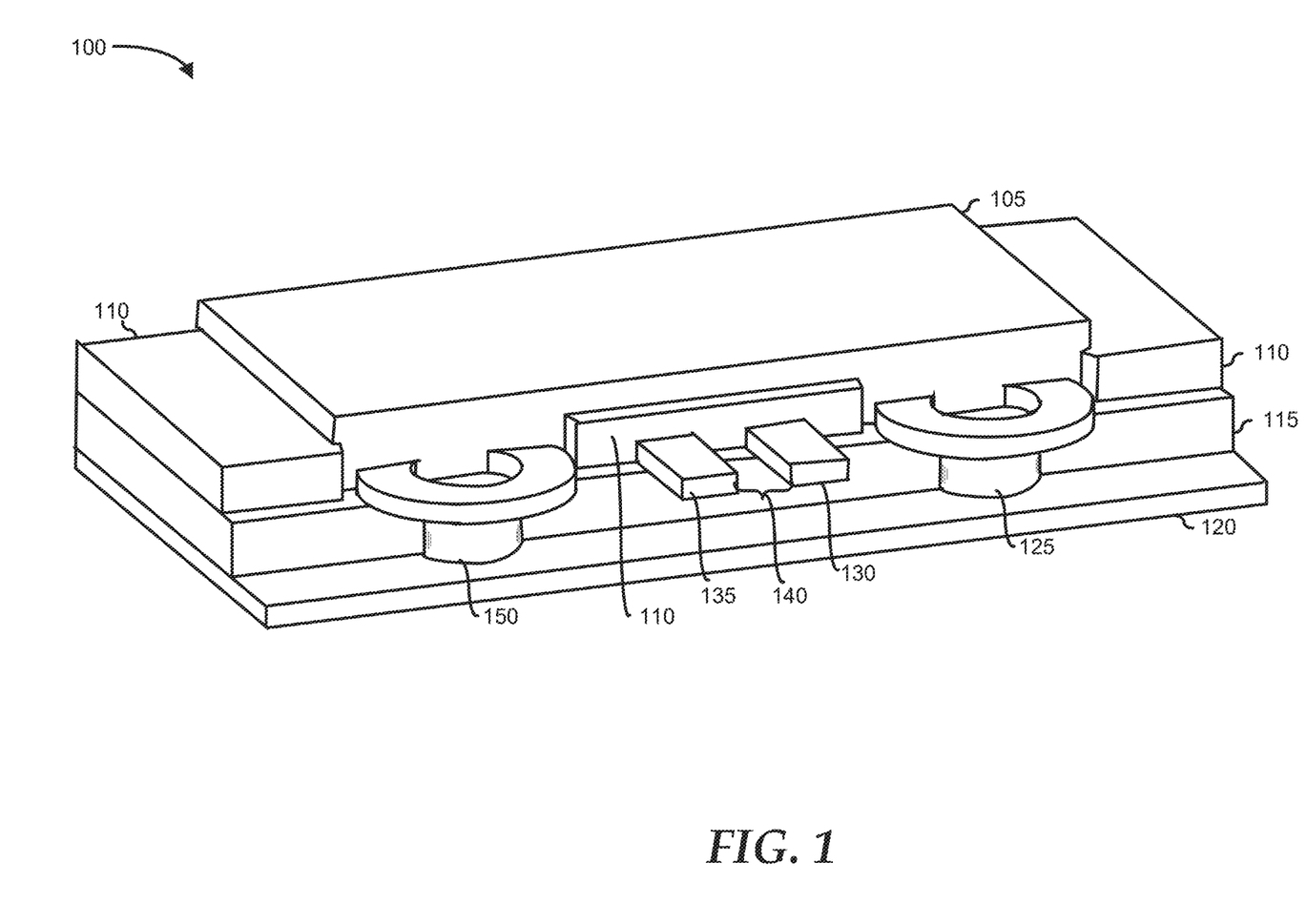
FIG. 1 is a diagram of a perspective view of a printed circuit board, according to an embodiment of the present disclosure.
Figure 7:
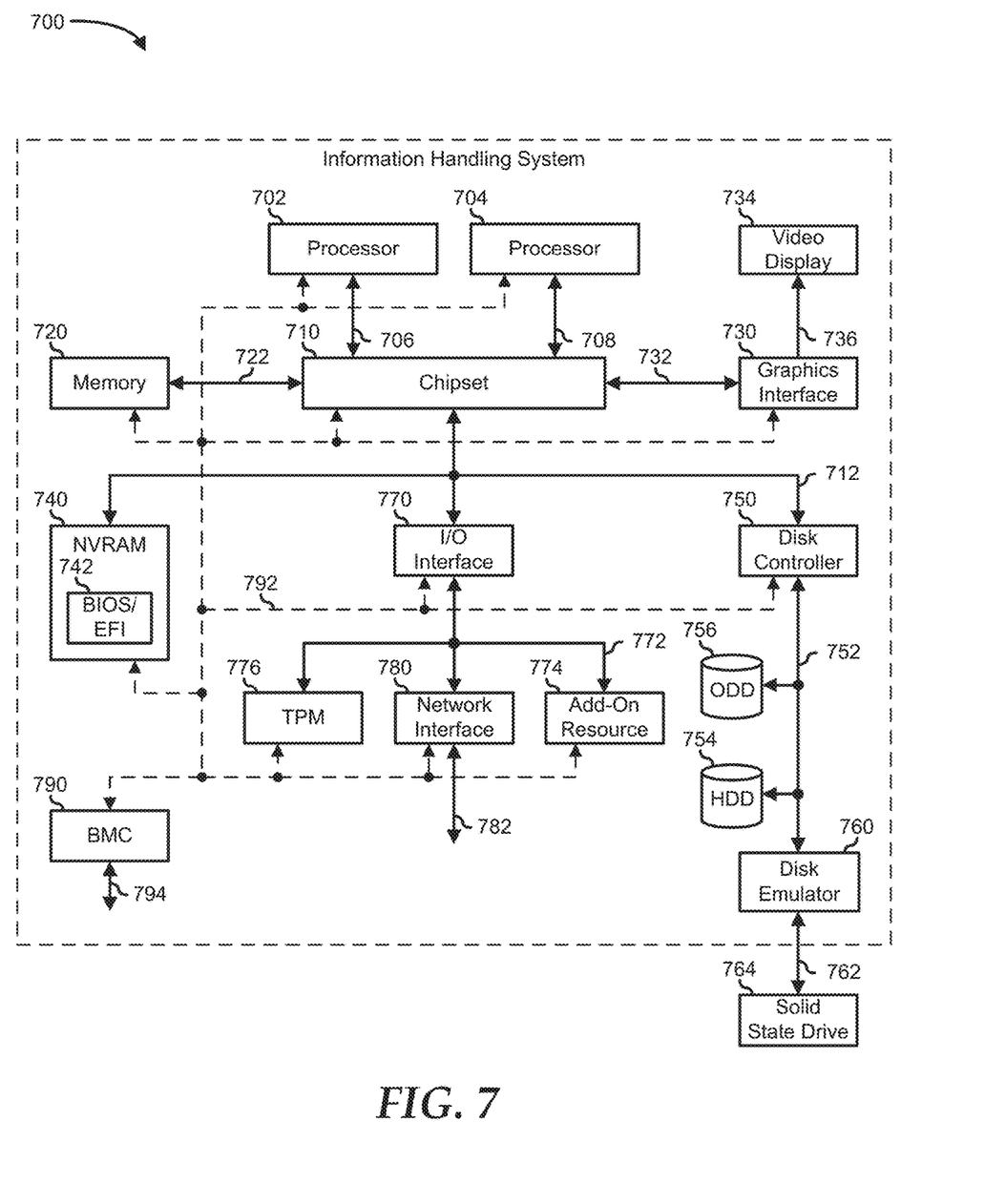
FIG. 7 is a block diagram of an information handling system, according to an embodiment of the present disclosure.

FIG. 1 shows a printed circuit board (PCB) 100 of an information handling system, similar to information handling system 700 of FIG. 7. For purposes of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, the information handling system can include processing resources for executing machine-executable code, such as a processor, a programmable logic array (PLA), an embedded device such as a System-on-a-Chip (SoC), or other control logic hardware. The information handling system can also include one or more computer-readable media for storing machine-executable code, such as software or data.

An information handling system typically includes high-speed transmission line traces for routing information, and as speeds have increased, trace routing imperfections that were previously considered low risk have become an issue. The use of differential trace pairs has traditionally minimized crosstalk and electromagnetic interference and can achieve a constant or known characteristic impedance, which allows for impedance matching techniques that allow for high-speed transmissions of information over the differential trace pairs. However, as the transmission speeds over such differential trace pairs have increased, problems associated with crosstalk have become increasingly prevalent. Crosstalk is a phenomenon in which signal integrity is compromised when adjacent differential trace pairs are switching and noise from one differential trace pairs are switching and noise from one differential trace pair couples to an adjacent differential trace pair. For example, microstrip traces are known to exhibit considerable amounts of far-end crosstalk compared to stripline traces. This has resulted in most high-speed signal routing on circuit boards utilizing stripline traces. However, the use of stripline traces can lead to an increase in the number of signal layers in the circuit board and the resulting increases in the circuit board cost. Accordingly, it would be desirable to provide improved performance for the microstrip traces such that their behavior may be similar to the stripline traces. As such, in this example, PCB 100 may be configured with an enhanced microstrip trace.

PCB 100 includes a differential microstrip pair 140 that is shielded with a ground plane 120 and a conductive plane 105. Differential microstrip pair 140 includes microstrip traces 130 and 135. PCB 100 also includes dielectric layers 110 and 115, and vias 125 and 150. Vias 125 and 150 may be ground vias. Differential microstrip pair 140 may be disposed above dielectric layer 115. Further, portions of differential microstrip pair 140 may be covered with dielectric layer 110. One of ordinary skill in the art would recognize that any suitable number of differential microstrip pairs, solder masks, dielectric layers, vias, ground plane, etc. may be part of PCB 100 without varying from the scope of this disclosure. Further, the components shown are not drawn to scale and PCB 100 may include additional or fewer components.

Differential microstrip pair 140 may be utilized in any suitable environment including, but not limited to, a surface-mount technology connector breakout and alternating current coupling capacitor connection. In this example, differential microstrip pair 140 may be enhanced to emulate the behavior of a differential stripline pair. Such enhancement may include providing a structure that is substantially similar to a stripline structure. Accordingly, this structure includes dielectric layer 110, and conductive plane 105 which is connected to a ground. In this example, conductive plane 105 may be connected to ground plane 120 through vias 150 and 125. Dielectric layer 110 may function as a secondary dielectric layer while dielectric layer 115 may function as a primary dielectric layer and disposed underneath differential microstrip pair 140 and above ground plane 120.

Dielectric layer 110 may be a solder mask which is a thin lacquer-like layer of polymer that is usually applied to the traces of a PCB for protection against oxidation and to prevent solder bridges from forming between closely spaced solder pads. Once applied, openings may be made in the solder mask wherever components are soldered, which may be accomplished using photolithography as an example. Dielectric layer 110 may be applied on the top surface of differential microstrip pair 140 and dielectric layer 115. Dielectric layer 110 may be disposed between dielectric layer 115 and conductive plane 105. In addition, the solder mask may be applied using multiple coats to increase thickness and reduce the impact of bubbles. The material used for dielectric layer 110 may have a similar or lower dielectric constant compared to the pre-impregnated material of dielectric layer 115.

Figure 6:
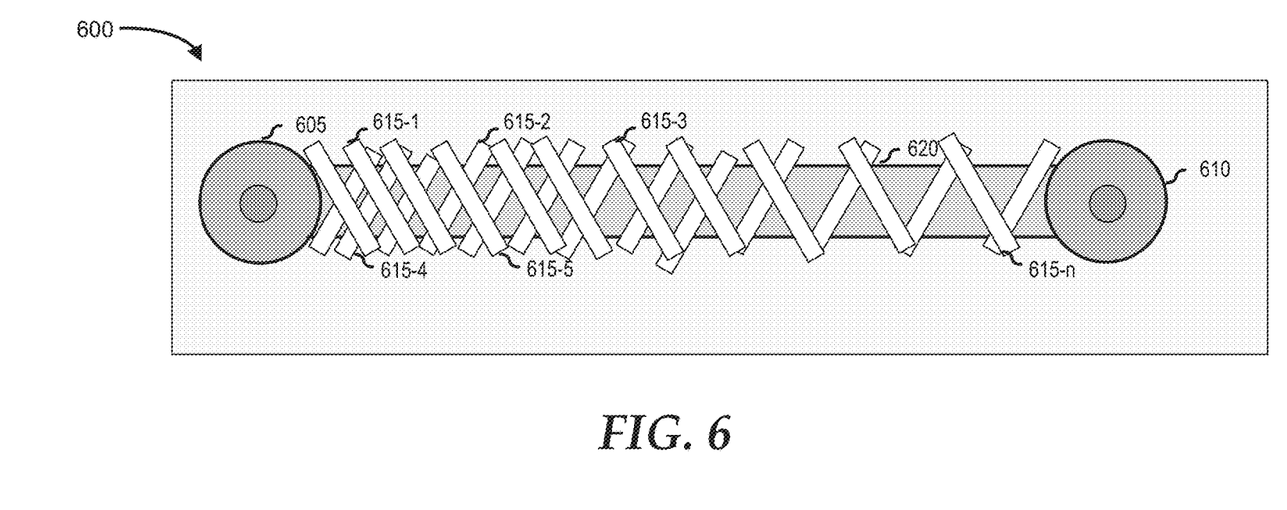

Conductive plane 105, which may function as a secondary reference plane in addition to ground plane 120, may be a conductive silk screen which can be a conductive filler material mixed with epoxy paint. The conductivity of conductive plane 105 does not have to match the conductivity of copper, which is used for ground plane 120. Conductive plane 105 may just be conductive enough to terminate weak electromagnetic fields surrounding differential microstrip pair 140. In one embodiment, a hatched paint pattern as depicted in FIG. 6 may be used to weaken the conductive plane, as a method to fine-tune impedance, as described further below.

Conductive plane 105 may be applied on a top surface of a portion of dielectric layer 110 and vias 125 and 150. Thus, instead of differential microstrip pair 140 typically being exposed to air, the structure may shield differential microstrip pair 140. Conductive plane 105 may be grounded with exposed copper of ground plane 120 through vias 150 and 125. Although in this example, conductive plane 105 was depicted to shield one differential microstrip pair, one of skill in the art will appreciate that the conductive plane may be used to cover several microstrip traces as a group for higher routing density. In a particular embodiment, vias 150 and 125 are provided at a first end of differential microstrip pair 140, and one or more additional vias may be provided along the length of the differential microstrip pair, including at a second end of the differential microstrip pair, as needed or desired.

Although an embodiment of the present disclosure is applied to differential microstrip pair 140 which is at a top surface of PCB 100, teachings of the present disclosure may be applied to a single microstrip trace. In addition, the teachings of the present disclosure may be applied to differential microstrip trace pairs and single microstrip traces at a bottom surface of a PCB. In addition, because the structure disclosed herein is implemented using current PCB manufacturing processes, it can be easily implemented. In particular, dielectric layer 110 may be provided during a solder mask application process step of the manufacturing of the PCB, where a solder mask pattern is modified to include voids to permit the electrical contact between vias 125 and 150, and conductive plane 105. Further, conductive plane 105 may be provided during a silk screen application process step of the manufacturing of the PCB, where the silk screen ink is modified to include a conductive material, and where a silk screen mask pattern is modified to include printed areas surrounding differential microstrip pair 140. It will be understood that the teachings of the enhanced microstrip trace as described herein may be utilized in conjunction with single-ended microstrip traces, or other microstrip traces as needed or desired.

PCB 100 represents a circuit board that provides a desired function for data processing, such as for an information handling system. PCB 100 provides circuit traces, component pads, and through-hole mounting locations for the components that provide the functions and features of the information handling system. As such, PCB 100 will be understood to be fabricated as a multi-layer PCB with various circuit traces formed on the front and back surfaces of the PCB with various signal layers, power layers, and the like. The various circuit traces and layers may be formed of gold, nickel, tin, tin-lead, or other material, as needed or desired. The circuit trace layers, ground layers, and power layers are sandwiched between insulating layers of PCB material which may include pre-impregnated fiberglass, Duriod®, flame redundant-4, epoxy resin, or the like, as needed, or desired. The circuit trace layers, and power layers may include copper layers, aluminum layers, iron layers, or the like, as needed, or desired. During the assembly processes of the information handling system, various components are placed onto PCB 100 in through-hole mounting locations, surface mounting locations, and the like, and in a solder reflow process, the connections of the components are electrically connected to the PCB. The details of the PCB design, manufacturing, and electronic device assembly onto a PCB are known in the art, and will not be further described herein, except as needed to illustrate the current embodiments.

Figure 2:
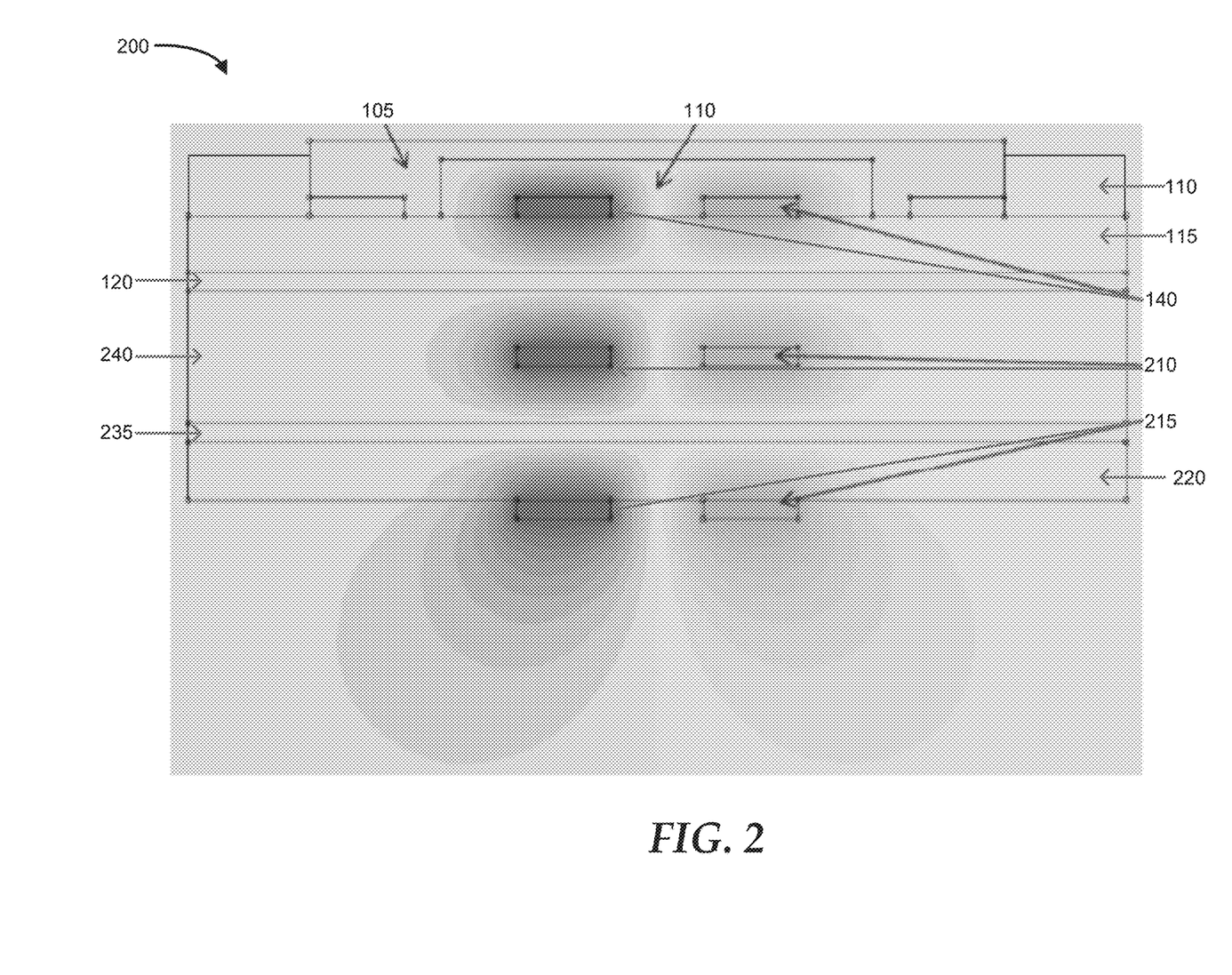
FIG. 2 is a diagram of electromagnetic waves transmitted by traces of a printed circuit board, according to an embodiment of the present disclosure.

FIG. 2 shows a diagram depicting electromagnetic fields transmitted by traces of a PCB 200. PCB 200, which is similar to PCB 100 of FIG. 1, includes conductive plane 105, dielectric layer 110, dielectric layer 115, ground plane 120, differential microstrip pair 140, a differential stripline pair 210, a differential microstrip pair 215, a dielectric layer 220, ground plane 235, and dielectric layer 240. Dielectric layer 240 may also be referred to as a dielectric substrate.

A typical microstrip trace, such as differential microstrip pair 215 is surrounded by a dielectric layer 220 and air. Thus, an effective dielectric constant for the differential microstrip pair is between that of the air and material used for dielectric layer 220. In addition, the electromagnetic fields produced by differential microstrip pair 215 exist partly in the air and partly in dielectric layer 220. Thus, differential microstrip pair 215 may not support a true transverse electromagnetic mode and is dispersive.

A typical stripline trace, such as differential stripline pair 210 is surrounded by dielectric layer 240 which is connected to ground planes 120 and 235. Accordingly, the differential stripline pair may support a true transverse electromagnetic mode and is non-dispersive. Thus, the high-frequency signal remains inside the PCB, shielding it from spurious signals. In addition, being surrounded by a dielectric material raises capacitance per unit length of differential stripline pair 210 as compared to the high-frequency signal of differential microstrip pair 215. As such, striplines generally have lower impedance than microstrips and there are fewer emissions and crosstalk.

With an enhanced microstrip trace, such as differential microstrip pair 140, its structure may emulate the typical stripline trace. For example, differential microstrip pair 140 is surrounded by dielectric materials, such as dielectric layers 110 and 115, and is shielded top and bottom, such as by ground plane 120 and conductive plane 105. Thus, similar to differential stripline pair 210, the high-frequency signal of differential microstrip pair 140 remains inside the PCB, shielding it from spurious signals. In addition, conductive plane 105 may be connected to ground plane 120. Accordingly, the capacitance per unit length of differential microstrip pair 140 may be raised and its impedance lowered similar to differential stripline pair 210. As such, the enhanced microstrip trace has a substantially similar signal integrity performance to that of a stripline trace. Thus, by applying embodiments of the present disclosure, characteristics of a microstrip may be enhanced to be similar to the characteristics of a stripline.

However, there may also be instances that the impedance of the enhanced microstrip trace may be fine-tuned, such as to transition the impedance of the microstrip trace, also referred to simply as a microstrip, from one end of the microstrip to the other end when there is an impedance mismatch. Impedance mismatches may arise at the PCBs due to different manufacturing processes and controls among suppliers of the electronic components. Impedance control from one point to another point is difficult to control due to mismatch possibilities at connection pads, also referred to herein simply as pads. For example, this is particularly problematic when one end of a microstrip is connected to an electronic component with an impedance requirement that is different from the impedance requirement of another electronic component that is connected to the other end of the microstrip. Because of the impedance mismatch, unintended radio frequency noise may occur. Accordingly, the ability to control impedance mismatch as disclosed herein may resolve the unintended radio frequency noise. In controlling impedance, further enhancements may be performed on the structure configured to enhance the microstrip, such as depicted in FIGS. 3-6.

Figure 3:
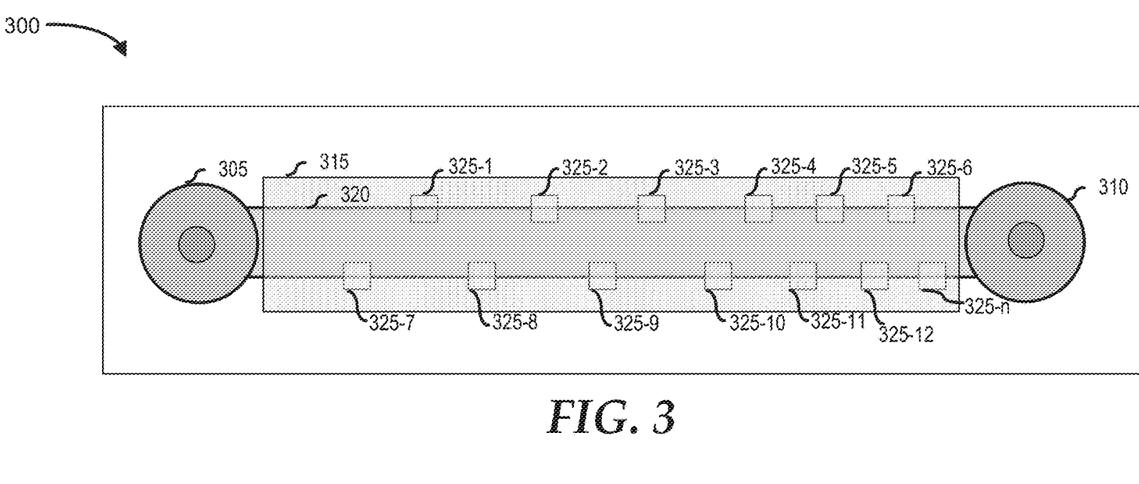
FIGS. 3-6 are diagrams of a printed circuit board with an impedance tuned microstrip trace of a printed circuit board, according to an embodiment of the present disclosure.

FIG. 3 shows a diagram of a PCB 300 of an information handling system, similar to information handling system 700 of FIG. 7. PCB 300 includes a microstrip trace 320 with a connection pad 305 at one end and a connection pad 310 at its other end. Connection pads 305 and 310 represent exposed regions of metal on PCB 300 where a component may be coupled or soldered. In one example, connection pads 305 and 310 may be vias. Microstrip trace 320 may be similar to microstrip trace 130 or 135 while conductive plane 315 is similar to conductive plane 105. However, in this example, conductive plane 315 includes cutouts 325-1 through 325-n, also referred to simply as cutouts 325. Cutouts 325 may be used to adjust the impedance of microstrip trace 320.

PCB 300 may be used to interconnect one or more electronic components. For example, a transmitter may be physically coupled to PCB 300 via connection pad 305. A receiver may also be physically coupled to PCB 300 via connection pad 310. The transmitter may communicate with the receiver via microstrip trace 320 or vice versa. In this example, the impedance requirement of the transmitter is less than the impedance requirement of the receiver. For example, the transmitter may have an impedance of 85 ohms while the receiver may have an impedance of 100 ohms. As such, the impedance measured at connection pad 305 should match the impedance requirement of the transmitter. To achieve this, the impedance of microstrip trace 320 may be fine-tuned using cutouts 325. The number of cutouts, their pattern, and their density may be pre-determined during the design of PCB 300.

In one embodiment, the cutout density of cutouts 325 may gradually change over the length of microstrip trace 320. The value of the impedance may be in direct proportion to the cutout density. For example, the impedance may increase with the increase of the cutout density. In addition, the cutouts may be more or less porous near vias or connectors to help with impedance transitions. This may allow the impedance transition to over a few wavelengths of a signal. The gradual transition of the impedance may be over several wavelengths of a transmitted signal. This may help avoid sharp edges in the reflection patterns. In addition, the impedance may be varied by having small adjustments along the length of the microstrip trace. This is desirable as the variation allows for greater impedance control without generating unwanted noise or crosstalk. In this example, the cutout density is greater towards connection pad 310 where the impedance is greater in comparison to the cutout density towards connection pad 310 where the impedance is less. However, each microstrip in a differential microstrip pair may have the same number of cutouts per unit length.

Figure 5:
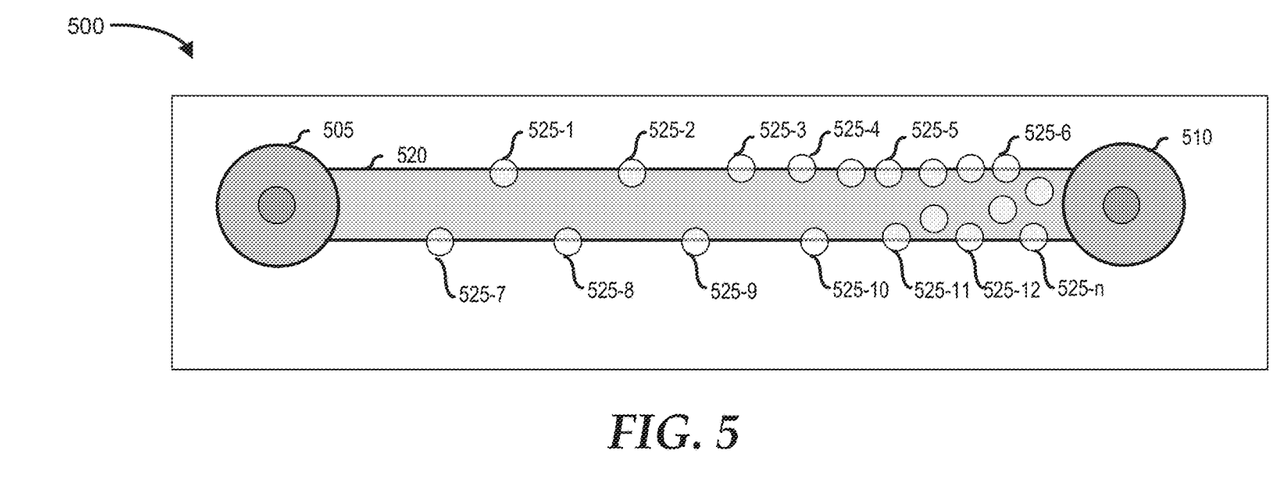

In this example, cutouts 325 are depicted as squares. However, the cutouts may vary in shape and size. For example, triangular or hexagonal cutouts, such as a honeycomb design may be used to minimize the cutouts being parallel to the microstrip trace. Different cutout shapes may also be combined, such as a triangular around the edges of the microstrip and square or circular towards the middle. To form the cutouts, one approach may be to first determine the impedance requirement and then design the cutouts accordingly. The cutouts or holes may be formed using a silk screen process or by one of various other techniques that would be apparent to one of skill in the art in possession of the present disclosure. For example, the silk screen process may be used to apply the design to the PCB using a negative silk screen image as depicted in FIG. 5 or a positive silk screen image as depicted in FIG. 6. Non-conductive ink traces may be applied to identify the location, number, and size of the cutouts. For negative silk screen images, for example, as conductive material is painted on the printed circuit board for the microstrips, the painting may skip the ink traces. Thus, holes may be formed where the non-conductive ink traces are applied. The area can also be painted over with non-conductive silk screen for protection. The silk screen process may also be used to apply a hatched paint pattern for the cutouts, as depicted in FIG. 6, wherein the conductive silk screen may form the hatches.

Figure 4:
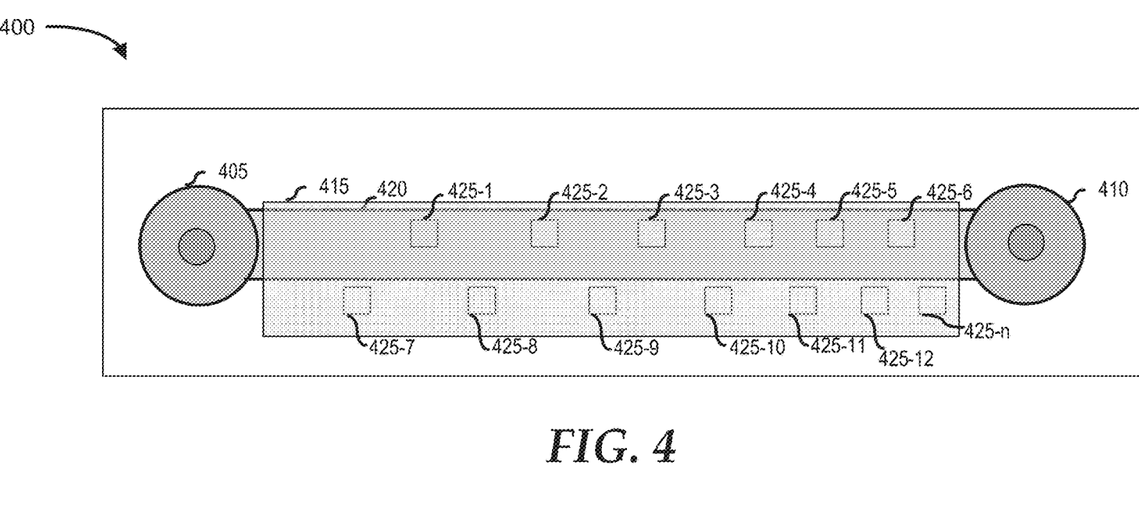

Because impedance is insensitive to silk screen positioning tolerances, minor variances in length, width, and position of conductive plane 315 relative to microstrip trace 320 may have a minor impact on the impedance of microstrip trace 320. For example, while the width of conductive plane 415 is similar to the width of conductive plane 315, the position of conductive plane 415 relative to microstrip trace 320 may be different than that of conductive plane 315, as depicted in FIG. 4, due to a registration inaccuracy. However, because cutouts 425-1 through 425-6 are fully disposed on the surface of microstrip trace 320 in comparison to cutouts 325-1 through 325-6, the impedance transition of microstrip trace 320 may be similar to microstrip trace 420. In addition, because cutouts 325 are small enough and not dense enough, some high-speed return current can flow through microstrip trace 320 while the rest can flow through a ground plane. One of skill in the art will appreciate that the width of the conductive plane, such as conductive planes 315 and 415, may be narrower or wider at manufacture than depicted.

FIG. 4, FIG. 5, and FIG. 6 show diagrams of PCBs of an information handling system that is similar to information handling system 700 of FIG. 7. The PCBs are similar to PCB 100 of FIG. 1. Microstrip traces shown in these figures include variations in the format of the conductive silk screen and the size, shape, and density of cutouts of the conductive silk screen. FIG. 5 shows a negative silk screen image of a PCB, while FIG. 6 shows a positive silk screen image.

Referring to FIG. 4, PCB 400 includes a microstrip trace 420 between connection pads 405 and 410. PCB 400 includes a conductive plane 415 on a portion of a top surface of microstrip trace 420, wherein conductive plane 415 further includes cutouts 425-1 through 425-n. As stated above the position of conductive plane 415 relative to microstrip trace 420 may have a variance in contrast to the position of conductive plane 315 relative to microstrip trace 320. Referring to FIG. 5, PCB 500 includes a microstrip trace 520 between connection pads 505 and 510. PCB 500 includes a conductive plane on a portion of a top surface of microstrip trace 520, wherein the conductive plane further includes cutouts 525-1 through 525-n. In this example, the cutouts of the conductive plane are circular. Referring to FIG. 6, PCB 600 includes a microstrip trace 620 between connection pads 605 and 610. PCB 600 includes a conductive plane 615 on a portion of a top surface of microstrip trace 620, wherein conductive plane 615 is a hatched pattern of a conductive silk screen that includes hatches 615-1 through 615-n. Because of the hatched pattern of conductive plane 615, some low-speed return current can flow through microstrip trace 620 while the rest can flow through a ground plane. The hatched pattern can change gradually over distance and can be more or less porous around vias or connectors to help with the impedance transitions. Because of the hatched pattern of conductive plane 615 and the density of the pattern, low-speed return current can flow through microstrip trace 620. As such, the speed of the return current flow may be based on the density and size of the pattern or cutout.

One of skill in the art will appreciate that the present disclosure may be used instead of or in conjunction with other techniques of gradually changing the impedance of a microstrip, such as by tapering the width of the microstrip traces. For example, the present disclosure may be utilized when modifying the impedance by tapering or adjusting the width of a microstrip is limited by various concerns. For example, the tapering the microstrip may be limited by manufacturing issues, such as the width of the microstrip is too narrow for etching, and density at low impedance, such as when the microstrip is too wide to fit the design.

FIG. 7 illustrates an embodiment of an information handling system 700 including processors 702 and 704, a chipset 710, a memory 720, a graphics adapter 730 connected to a video display 734, a non-volatile RAM (NV-RAM) 740 that includes a basic input and output system/extensible firmware interface (BIOS/EFI) module 742, a disk controller 750, a hard disk drive (HDD) 754, an optical disk drive 756, a disk emulator 760 connected to a solid-state drive (SSD) 764, an input/output (I/O) interface 770 connected to an add-on resource 774 and a trusted platform module (TPM) 776, a network interface 780, and a baseboard management controller (BMC) 790. Processor 702 is connected to chipset 710 via processor interface 706, and processor 704 is connected to the chipset via processor interface 708. In a particular embodiment, processors 702 and 704 are connected via a high-capacity coherent fabric, such as a HyperTransport link, a QuickPath Interconnect, or the like. Chipset 710 represents an integrated circuit or group of integrated circuits that manages the data flow between processors 702 and 704 and the other elements of information handling system 700. In a particular embodiment, chipset 710 represents a pair of integrated circuits, such as a northbridge component and a southbridge component. In another embodiment, a number or all the functions and features of chipset 710 are integrated with one or more of processors 702 and 704.

Memory 720 is connected to chipset 710 via a memory interface 722. An example of memory interface 722 includes a Double Data Rate (DDR) memory channel and memory 720 represents one or more DDR Dual In-Line Memory Modules (DIMMs). In a particular embodiment, memory interface 722 represents two or more DDR channels. In another embodiment, one or more processors 702 and 704 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 720 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 730 is connected to chipset 710 via a graphics interface 732 and provides a video display output 736 to a video display 734. An example of a graphics interface 732 includes a Peripheral Component Interconnect-Express (PCIe) interface and graphics adapter 730 can include a four-lane (×4) PCIe adapter, an eight-lane (×8) PCIe adapter, a 16-lane (×16) PCIe adapter, or another configuration, as needed or desired. In a particular embodiment, graphics adapter 730 is provided down on a system printed circuit board (PCB). Video display output 736 can include a Digital Video Interface (DVI), a High-Definition Multimedia Interface (HDMI), a DisplayPort interface, or the like, and video display 734 can include a monitor, a smart television, an embedded display such as a laptop computer display, or the like.

NV-RAM 740, disk controller 750, and I/O interface 770 are connected to chipset 710 via an I/O channel 712. An example of I/O channel 712 includes one or more point-to-point PCIe links between chipset 710 and each of NV-RAM 740, disk controller 750, and I/O interface 770. Chipset 710 can also include one or more other I/O interfaces, including a PCIe interface, an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 740 includes BIOS/EFI module 742 that stores machine-executable code (BIOS/EFI code) that operates to detect the resources of information handling system 700, to provide drivers for the resources, to initialize the resources, and to provide common access mechanisms for the resources. The functions and features of BIOS/EFI module 742 will be further described below.

Disk controller 750 includes a disk interface 752 that connects the disc controller to a hard disk drive (HDD) 754, to an optical disk drive (ODD) 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an institute of electrical and electronics engineers (IEEE) 1394 (Firewire) interface, a proprietary interface, or a combination thereof. Alternatively, SSD 764 can be disposed within information handling system 700.

I/O interface 770 includes a peripheral interface 772 that connects the I/O interface to add-on resource 774, to TPM 776, and to network interface 780. Peripheral interface 772 can be the same type of interface as I/O channel 712 or can be a different type of interface. As such, I/O interface 770 extends the capacity of I/O channel 712 when peripheral interface 772 and the I/O channel are of the same type, and the I/O interface translates information from a format suitable to the I/O channel to a format suitable to the peripheral interface 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board, or add-in card disposed within information handling system 700, a device that is external to the information handling system, or a combination thereof.

Network interface 780 represents a network communication device disposed within information handling system 700, on a main circuit board of the information handling system, integrated onto another component such as chipset 710, in another suitable location, or a combination thereof. Network interface 780 includes a network channel 782 that provides an interface to devices that are external to information handling system 700. In a particular embodiment, network channel 782 is of a different type than peripheral interface 772, and network interface 780 translates information from a format suitable to the peripheral channel to a format suitable to external devices.

In a particular embodiment, network interface 780 includes a NIC or host bus adapter (HBA), and an example of network channel 782 includes an InfiniBand channel, a Fibre Channel, a Gigabit Ethernet channel, a proprietary channel architecture, or a combination thereof. In another embodiment, network interface 780 includes a wireless communication interface, and network channel 782 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 782 can be connected to an external network resource (not illustrated). The network resource can include another information handling system, a data storage system, another network, a grid management system, another suitable resource, or a combination thereof.

BMC 790 is connected to multiple elements of information handling system 700 via one or more management interface 792 to provide out of band monitoring, maintenance, and control of the elements of the information handling system. As such, BMC 790 represents a processing device different from processor 702 and processor 704, which provides various management functions for information handling system 700. For example, BMC 790 may be responsible for power management, cooling management, and the like. The term BMC is often used in the context of server systems, while in a consumer-level device, a BMC may be referred to as an embedded controller (EC). A BMC included in a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 790 can vary considerably based on the type of information handling system. BMC 790 can operate in accordance with an Intelligent Platform Management Interface (IPMI). Examples of BMC 790 include an Integrated Dell® Remote Access Controller (iDRAC).

Management interface 792 represents one or more out-of-band communication interfaces between BMC 790 and the elements of information handling system 700, and can include a $I^2C$ bus, a System Management Bus (SMBus), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 700, that is apart from the execution of code by processors 702 and 704 and procedures that are implemented on the information handling system in response to the executed code.

BMC 790 operates to monitor and maintain system firmware, such as code stored in BIOS/EFI module 742, option ROMs for graphics adapter 730, disk controller 750, add-on resource 774, network interface 780, or other elements of information handling system 700, as needed or desired. In particular, BMC 790 includes a network interface 794 that can be connected to a remote management system to receive firmware updates, as needed or desired. Here, BMC 790 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 790 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 790, an interface defined by the Distributed Management Taskforce (DMTF) (such as a Web Services Management (WSMan) interface, a Management Component Transport Protocol (MCTP) or, a Redfish® interface), various vendor defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 790 is included on a main circuit board (such as a baseboard, a motherboard, or any combination thereof) of information handling system 700 or is integrated onto another element of the information handling system such as chipset 710, or another suitable element, as needed or desired. As such, BMC 790 can be part of an integrated circuit or a chipset within information handling system 700. An example of BMC 790 includes an iDRAC, or the like. BMC 790 may operate on a separate power plane from other resources in information handling system 700. Thus BMC 790 can communicate with the management system via network interface 794 while the resources of information handling system 700 are powered off. Here, information can be sent from the management system to BMC 790 and the information can be stored in a RAM or NV-RAM associated with the BMC. Information stored in the RAM may be lost after power-down of the power plane for BMC 790, while information stored in the NV-RAM may be saved through a power-down/power-up cycle of the power plane for the BMC.

Information handling system 700 can include additional components and additional buses, not shown for clarity. For example, information handling system 700 can include multiple processor cores, audio devices, and the like. While a particular arrangement of bus technologies and interconnections is illustrated for the purpose of example, one of skill will appreciate that the techniques disclosed herein are applicable to other system architectures. Information handling system 700 can include multiple central processing units (CPUs) and redundant bus controllers. One or more components can be integrated together. Information handling system 700 can include additional buses and bus protocols, for example, I²C and the like. Additional components of information handling system 700 can include one or more storage devices that can store machine-executable code, one or more communications ports for communicating with external devices, and various input and output (I/O) devices, such as a keyboard, a mouse, and a video display.

As used herein, a hyphenated form of a reference numeral refers to a specific instance of an element and the un-hyphenated form of the reference numeral refers to the collective or generic element. Thus, for example, cutouts "325-1" refers to an instance of a cutout class, which may be referred to collectively as cutouts "325" and any one of which may be referred to generically as a cutout "325."

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes, or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A printed circuit board comprising:
   a first connection pad coupled to a first portion of a microstrip trace;
   a second connection pad coupled to a second portion of the microstrip trace;
   the microstrip trace having a first impedance along the first portion and a second impedance along the second portion; and
   a conductive plane on a top surface of the microstrip trace, wherein the conductive plane includes a plurality of cutouts to reduce impedance mismatch between the first impedance and the second impedance.

2. The printed circuit board of claim 1, wherein density of the cutouts is greater along the first portion than along the second portion.

3. The printed circuit board of claim 1, wherein the first impedance is greater than the second impedance.

4. The printed circuit board of claim 1, wherein a high-speed return current or a lower-speed return current can flow through the microstrip trace based on density of the cutouts.

5. The printed circuit board of claim 1, wherein a high-speed return current or a lower-speed return current can flow through the microstrip trace based on size of the cutouts.

6. The printed circuit board of claim 1, wherein the conductive plane is a conductive silk screen.

7. The printed circuit board of claim 1, wherein the microstrip trace has a varying impedance from the first portion to the second portion.

8. The printed circuit board of claim 7, wherein the varying impedance is highest at the first portion and lowest at the second portion.

9. A microstrip trace, comprising:
   a first portion having a first impedance;
   a second portion having a second impedance; and
   a conductive plane shielding the microstrip trace between the first portion and the second portion, wherein the conductive plane includes a plurality of cutouts to reduce impedance mismatch between the first impedance and the second impedance.

10. The microstrip trace of claim 9, wherein the first portion is physically coupled to a first connection pad.

11. The microstrip trace of claim 9, wherein the second portion is physically coupled to a second connection pad.

12. The microstrip trace of claim 9, wherein the conductive plane is a conductive silk screen.

13. The microstrip trace of claim 9, wherein the first impedance is not equal to the second impedance.

14. The microstrip trace of claim 9, wherein density of the cutouts is greater along the first portion than along the second portion.

15. The microstrip trace of claim 9, wherein impedance is greater along the first portion than along the second portion.

16. An information handling system comprising:
    a printed circuit board comprising:
      a first connection pad coupled to a first portion of a microstrip trace;
      a second connection pad coupled to a second portion of the microstrip trace;
      the microstrip trace having a first impedance along the first portion and a second impedance along the second portion; and
      a conductive plane that includes at least one cutout to reduce impedance mismatch between the first impedance and the second impedance.

17. The information handling system of claim 16, wherein the conductive plane is a conductive silk screen.

18. The information handling system of claim 16, wherein an impedance measurement is different around the first connection pad and the second connection pad.

19. The information handling system of claim 16, wherein the first connection pad is physically coupled with a first electronic component with an impedance requirement that is different than a second electronic component that is physically coupled to the second connection pad.

20. The information handling system of claim 16, wherein density of cutouts is different along the first connection pad than the second connection pad.

* * * * *